US012601769B2

(12) United States Patent
Kalluri et al.

(10) Patent No.: US 12,601,769 B2
(45) Date of Patent: Apr. 14, 2026

(54) INPUT ISOLATED VOLTAGE MONITOR

(71) Applicant: Hamilton Sundstrand Corporation, Charlotte, NC (US)

(72) Inventors: Nageswara Rao Kalluri, Bangalore (IN); Tanay Ghose, Kolkata (IN); Manish Kumar, Bangalore (IN); Bapu Kallappa Banahatti, Kota (IN); Premanshi Jain, Rajasthan (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 205 days.

(21) Appl. No.: 18/348,440

(22) Filed: Jul. 7, 2023

(65) Prior Publication Data

US 2024/0264208 A1 Aug. 8, 2024

(30) Foreign Application Priority Data

Feb. 6, 2023 (IN) .............................. 202311007407

(51) Int. Cl.
 G01R 19/165 (2006.01)
 G01R 15/04 (2006.01)
(52) U.S. Cl.
 CPC ....... G01R 19/16576 (2013.01); G01R 15/04 (2013.01)
(58) Field of Classification Search
 CPC ................ G01R 19/00; G01R 19/0084; G01R 19/0092; G01R 19/165; G01R 19/16566;
 (Continued)

(56) References Cited

U.S. PATENT DOCUMENTS 7,719,248 B1 5/2010 Melanson
8,120,931 B2 2/2012 Chang et al.
 (Continued)

FOREIGN PATENT DOCUMENTS

CN 101127487 A * 2/2008 ............ H02M 3/335
CN 101253372 A * 8/2008 ............ F24F 12/006
 (Continued)

OTHER PUBLICATIONS

Abstract for CN113243076 (B), Published: Nov. 1, 2022, 1 page.
 (Continued)

*Primary Examiner* — Hoai-An D. Nguyen
(74) *Attorney, Agent, or Firm* — CANTOR COLBURN LLP

(57) ABSTRACT

A voltage monitor for a fly-back circuit. The circuit includes a voltage source, a transformer comprising a primary winding electrically coupled to the voltage source and a secondary winding electrically coupled to a load, a diode connected between the secondary winding and the load, a switch electrically coupled to the primary winding and a controller operable to open and close the switch to control energy transfer from the primary winding to the secondary winding. The voltage monitor is connected to a node between the secondary winding and the diode that generates an output signal that is a toggling output when the voltage source is operating above an input voltage threshold and a constant output when the voltage source is operating below the input voltage threshold.

11 Claims, 7 Drawing Sheets

(58) Field of Classification Search
CPC .. G01R 19/16576; G01R 15/00; G01R 15/04;
H02M 1/00; H02M 1/32; H02M 3/00;
H02M 3/22; H02M 3/24; H02M 3/28;
H02M 3/325; H02M 3/335; H02M
3/33507; H02M 3/33523
USPC .......................................... 324/76.11, 140 R
See application file for complete search history.

(56) References Cited

U.S. PATENT DOCUMENTS

| | | | |
|---|---|---|---|
| 8,587,968 | B2 | 11/2013 | Zhu et al. |
| 9,318,962 | B2 | 4/2016 | Gao et al. |
| 2019/0341852 | A1 | 11/2019 | Fahlenkamp et al. |
| 2021/0376742 | A1 | 12/2021 | Liu et al. |
| 2022/0311329 | A1 | 9/2022 | Santoro et al. |
| 2024/0266962 | A1 | 8/2024 | Kalluri et al. |

FOREIGN PATENT DOCUMENTS

| | | | | | |
|---|---|---|---|---|---|
| CN | 105338681 | A | * | 2/2016 | ............ H02M 3/335 |
| CN | 113243076 | B | | 11/2022 | |
| JP | 2000125556 | A | * | 4/2000 | .............. H02M 3/28 |
| TW | 201322576 | A | * | 6/2013 | ........... H02H 7/1213 |

OTHER PUBLICATIONS

European Search Report for Application No. 24155374.2, mailed
Jul. 8, 2024, 7 pages.
European Search Report for Application No. 24155714.9, mailed
Jul. 5, 2024, 7 pages.

* cited by examiner

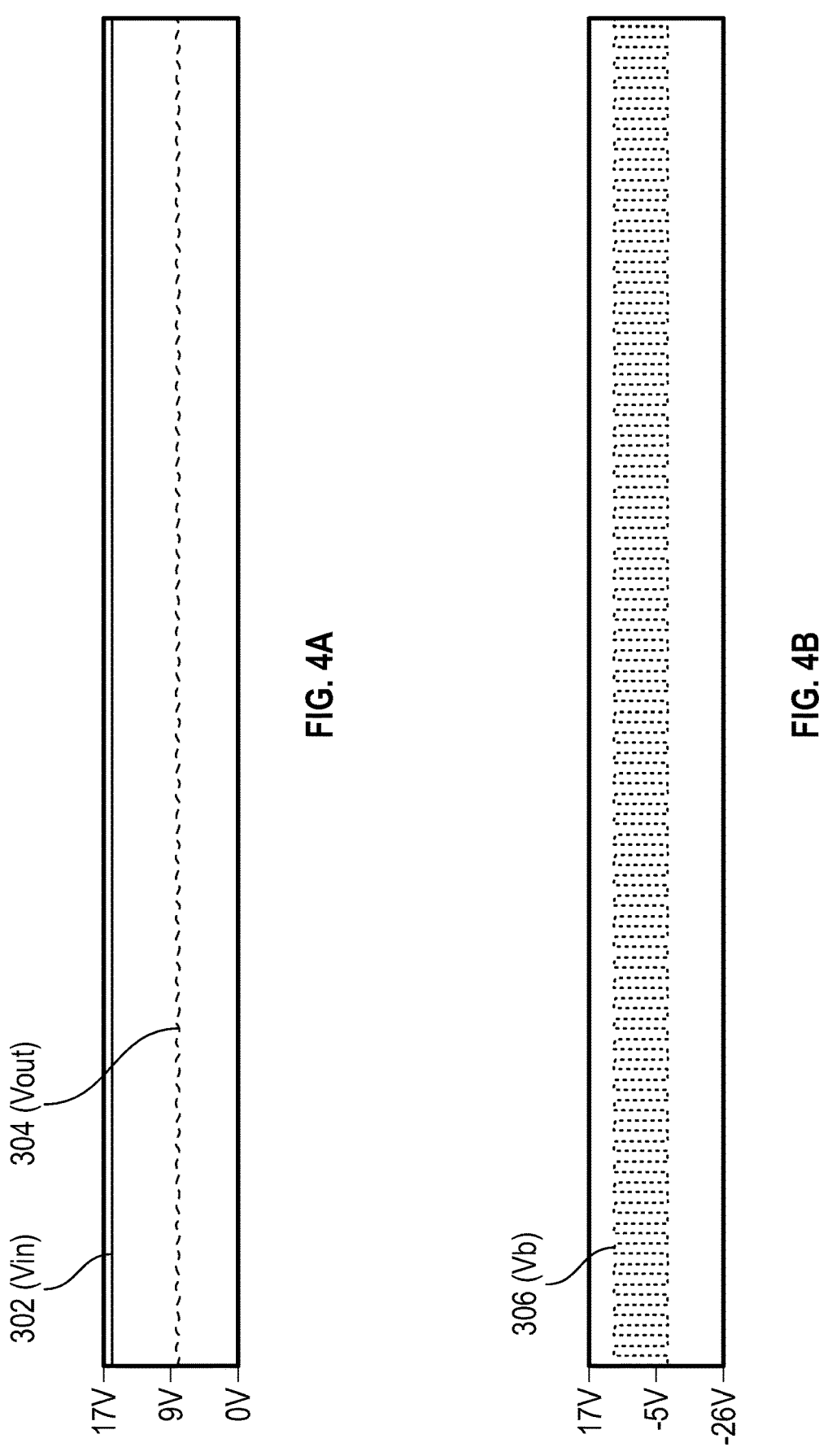

310 (Vth)

308 (VN2)

1.4V
1.0V
0.6V
0.2V
-0.2V
-0.6V
-1.0V 412 (CompOut)

6V
5V
4V
3V
2V
1V
0V 0.60ms  0.66ms  0.72ms  0.78ms  0.84ms  0.90ms  0.96ms  1.02ms  1.08ms  1.14ms  1.20ms  1.26ms

INPUT ISOLATED VOLTAGE MONITOR

CROSS-REFERENCE TO RELATED APPLICATIONS

This application claims the benefit of Indian Patent Application No. 202311007407 filed Feb. 6, 2023, which is incorporated herein by reference in its entirety.

BACKGROUND

Embodiments of the present disclosure relate to electrical power systems, and more particularly, to a voltage monitor connected to a secondary side of the DC-to-DC converter that monitors voltage on a primary side of the DC to DC converter.

One of the most common switching power supply converters is a Fly-back Converter. The fly-back topology is based on a buck-boost topology, with the transformer providing isolation and, if needed, voltage transformation by turns ratio.

The primary parameter that must be monitored for proper functioning of the Fly-back Converter is the voltage level on the primary side. If the input voltage drops below a predefined threshold and the same can be monitored and flagged, then this information can be used as a preemptory measure to indicate an impending power interrupt before the downstream power supplies stop operating. This "ahead-of-time" warning allows the system to signal the power interrupt condition to any other higher-level system in the architecture, log the failure data to any on-board memory and enter a fail-safe state before all power is lost.

The traditional means of determining this undervoltage condition is monitoring the voltage on the primary side and then passing the monitored level through an isolation barrier, to a control a device on the secondary side of the converter.

BRIEF DESCRIPTION

Disclosed is a fly-back circuit. The fly-back circuit includes a voltage source, a transformer comprising a primary winding electrically coupled to the voltage source and a secondary winding electrically coupled to a load and a diode connected between the secondary winding and the load. The circuit also includes a switch electrically coupled to the primary winding and a controller operable to open and close the switch to control energy transfer from the primary winding to the secondary winding. The circuit also includes a voltage monitor connected to a node between the secondary winding and the diode that generates an output signal that is a toggling output when the voltage source is operating above an input voltage threshold and a constant output when the voltage source is operating below the input voltage threshold.

In addition to one or more of the features described above, or as an alternative to any of the foregoing embodiments, the fly-back circuit can also include a control device connected to an output of the voltage monitor that determines that the voltage based on whether the output signal is toggling or not toggling.

In addition to one or more of the features described above, or as an alternative to any of the foregoing embodiments, the voltage monitor can also include a comparator that produces the output signal.

In addition to one or more of the features described above, or as an alternative to any of the foregoing embodiments, the comparator can include a first input connected to the node and second input connected to a monitor threshold voltage.

In addition to one or more of the features described above, or as an alternative to any of the foregoing embodiments, the first input is an inverting input and the second input is a non-inverting input.

In addition to one or more of the features described above, or as an alternative to any of the foregoing embodiments, the voltage circuit can further include a voltage divider between the node and the first input.

In addition to one or more of the features described above, or as an alternative to any of the foregoing embodiments, the first input is an inverting input and the second input is a non-inverting input.

In addition to one or more of the features described above, or as an alternative to any of the foregoing embodiments, the controller can be a pulse width modulation controller operable to output a sequence of pulses to open and close the switch based on determining that the voltage source exceeds a minimum control voltage.

Also disclosed is method that includes: providing with a voltage source an input voltage to a primary side of a fly-back circuit that includes primary winding and a secondary winding; controlling a switch electrically coupled to the primary winding to transition between an open state and a closed state to control energy transfer from the primary winding to the secondary winding; monitoring voltage with a voltage monitor connected to the secondary winding at a node; and generating an output signal with the voltage monitor that is a toggling output when the voltage source is operating above an input voltage threshold and a constant output when the voltage source is operating below the input voltage threshold.

In addition to one or more of the features described above, or as an alternative to any of the foregoing method embodiments, the method can further include analyzing with a control device connected to an output of the voltage monitor to determine that determines that the voltage based on whether the output signal is toggling or not toggling.

In addition to one or more of the features described above, or as an alternative to any of the foregoing method embodiments, analyzing can include: taking first and second measurements of a signal at the output of the voltage monitor, wherein the first and second measurement are delayed in time from one another; determining that the first and second measurements are different from one another; and returning to the step of taking.

In addition to one or more of the features described above, or as an alternative to any of the foregoing method embodiments, analyzing can include: taking first and second measurements of a signal at the output of the voltage monitor, wherein the first and second measurement are delayed in time from one another; determining that the first and second measurements are the same; and generating a flag indicating that the input voltage has fallen below a desired threshold.

In addition to one or more of the features described above, or as an alternative to any of the foregoing method embodiments, the voltage monitor includes a comparator that produces the output signal.

In addition to one or more of the features described above, or as an alternative to any of the foregoing method embodiments, the comparator includes a first input connected to the node and second input connected to a monitor threshold voltage.

In addition to one or more of the features described above, or as an alternative to any of the foregoing method embodiments, the first input is an inverting input and the second input is a non-inverting input.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIGS. 4A-4D show voltages at different locations in the fly-back converter of FIGS. 1 and 2 during an under-voltage situation.

DETAILED DESCRIPTION

A detailed description of one or more embodiments of the disclosed apparatus and method are presented herein by way of exemplification and not limitation with reference to the Figures.

In applications using a fly-back power supply for generating local on-board power supplies, there can be many components that add to system complexity. For example, the traditional means of determining this undervoltage condition from the input voltage (Vin from voltage source 26 below) require circuity that monitors the input voltage and then passes the monitored level through an isolation barrier, to a control device (e.g., voltage controller) on the secondary side of the converter. One disadvantage of this method is the use of an additional isolation barrier to allow the interfacing of the circuit output to the control device. This additional isolation requirement directly adds material cost, area, and complexity (to maintain the isolation) to the design.

Figure 1:
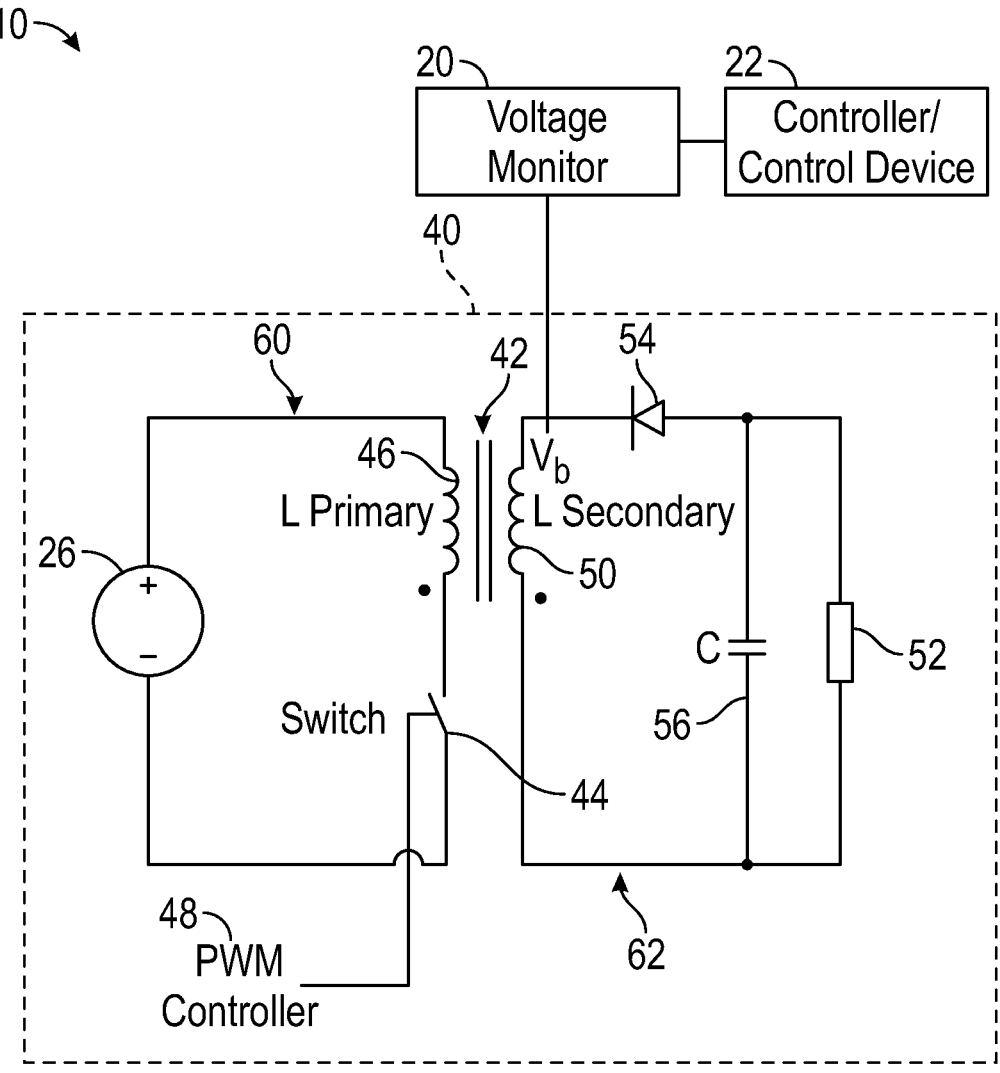
FIG. 1 is a schematic view of a fly-back converter in accordance with an embodiment of the disclosure.

Turning to the figures, FIG. 1 depicts a power supply circuit 10 including a voltage monitor 20 and a fly-back circuit 40.

The fly-back circuit 40 includes a switch 44 electrically coupled to the voltage source 26 and a primary winding 46 of the transformer 42. The transformer 42 also includes a secondary winding 50 electrically coupled to a load 52. A diode 54 shall in series with the load 52, and a capacitor 56 can be in parallel with the load 52. In some instances, the primary winding 46 and secondary winding 50 can be inductors that are air coupled to form the transformer 42. In short, the fly-back circuit 40 operates as a DC-to-DC converter and galvanically isolates the load 52 from the voltage source 52.

In embodiments, the controller 48 is operable to open and close the switch 44 to control energy transfer from the primary winding 46 to the secondary winding 50 Control logic of the controller 48 can be implemented by analog circuitry, executable instructions and/or digital circuitry, such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

Operation in this manner can create isolation between the voltage source 26 and devices (e.g., device controller 22) on the secondary side. For example, the controller 22 could be a device that controls operation of the load 52.

As noted above, in some cases the voltage at the voltage source 26 can fall below a desired level and this will, consequently, result in a voltage drop on the secondary side (e.g., Vb). The controller 22 may need to know that the voltage has fallen. However, as noted above, if there is monitor on the primary side providing that information to the controller 22, further isolation circuits can be required. Thus, disclosed herein is voltage monitor that can determine that the voltage at the voltage source 26 has fallen a desired threshold and that is not connected to the primary side of the fly-back converter. This is possible because Vb is a function of the primary voltage and the turns ratio of the transformer 42. Herein, the primary side of the fly-back converter is denoted by reference numeral 60 and the secondary side of the fly-back converter is denoted by reference numeral 62.

Figure 2:
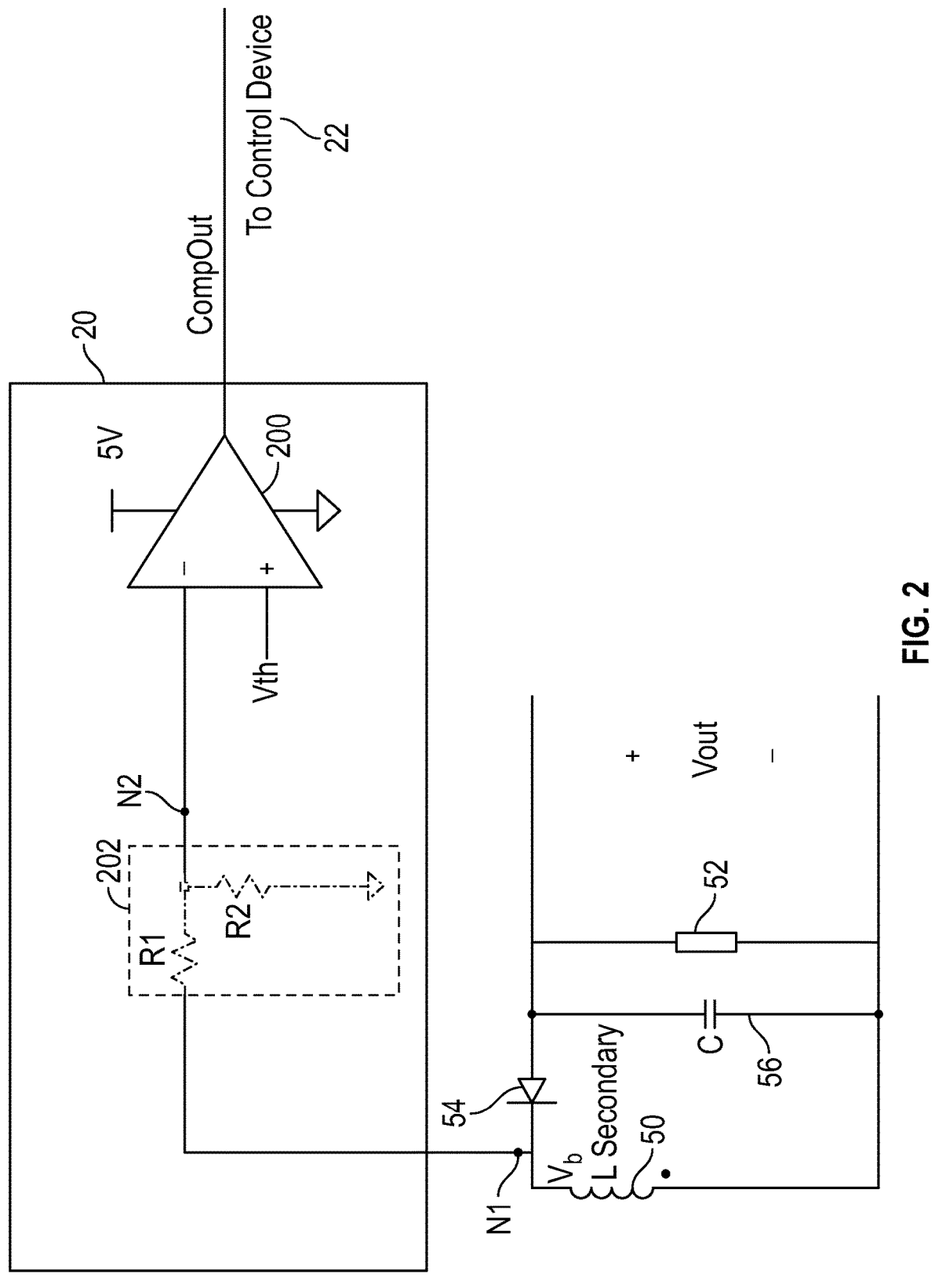
FIG. 2 is a more detailed depiction of a portion of the fly-back converter in accordance with an embodiment of the disclosure.

FIG. 2 a more detailed version of the voltage monitor 20 connected to the secondary side 62 of the fly-back converter. FIG. 2 will be discussed in relation to FIGS. 3A-3D.

The voltage monitor 20 is connected to a monitors the voltage at node (N1) that is electrically between the secondary winding 50 and the diode 54. The voltage at N1 is the voltage across the secondary winding 50 and is labelled at Vb in FIG. 2.

The voltage monitor 20 illustrated in FIG. 2 includes a comparator 200. This comparator 200 will compare the voltage at N1 (or a scaled version thereof) to a monitor threshold voltage Vth. In the event the voltage is to be scaled, an optional voltage divider 202 can be connected between N1 and the comparator 200. The reduced voltage is presented at node N2 and can be referred to as a reduced or divided voltage herein. The scaled or unscaled voltage is provided to a first input of the comparator 200. A threshold voltage Vth is connected to as second input of the comparator 200. As shown, the first input is the inverting input of the comparator 200 and the second input is the non-inverting input of the comparator 200. However, the skilled artisan can modify these connections (and thus Vth) without departing from the teachings herein.

The voltage divider is shown an including R1 serially connected between node N1 and node N2 and R2 being connected between node N2 and ground. The skilled artisan will realize that other voltage dividing configurations could be implemented. The comparator will produce an output (CompOut) as described below.

Figures 3A, 3B:
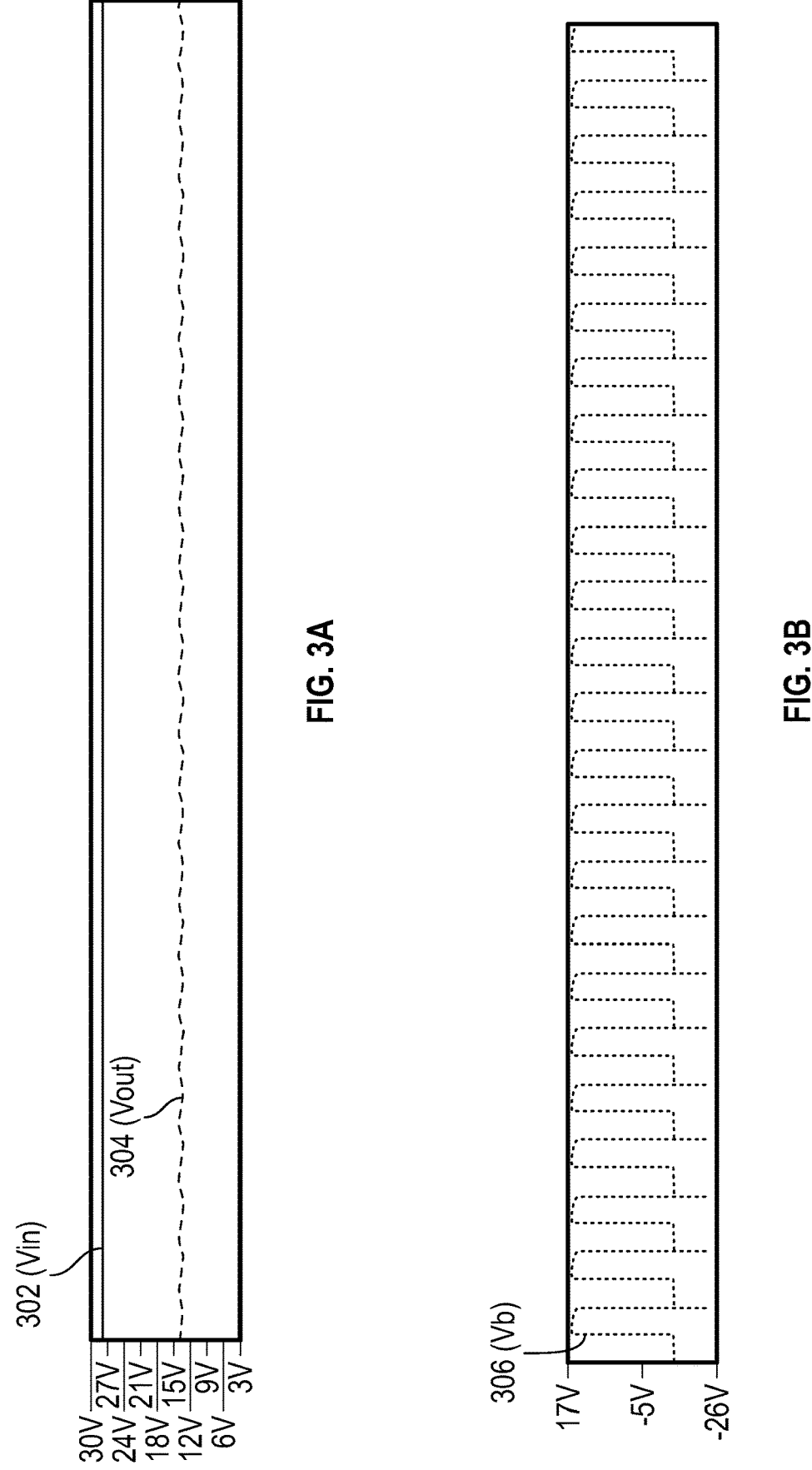
FIGS. 3A-3D show voltages at different locations in the fly-back converter of FIGS. 1 and 2.

With reference to FIGS. 2 and 3A-3D assume that the voltage source 26 is providing a constant voltage of approximately 27 V as shown in FIG. 3A by trace 302 and can be referred to a Vin herein. In normal operation, this will result (based on turns ratio) an output voltage (Vout) across the load 52 of about 14 V FIG. 3B as will be understood by the skilled artisan. This output voltage (Vout) is shown by trace 304 in FIG. 3A.

Figures 3C, 3D:
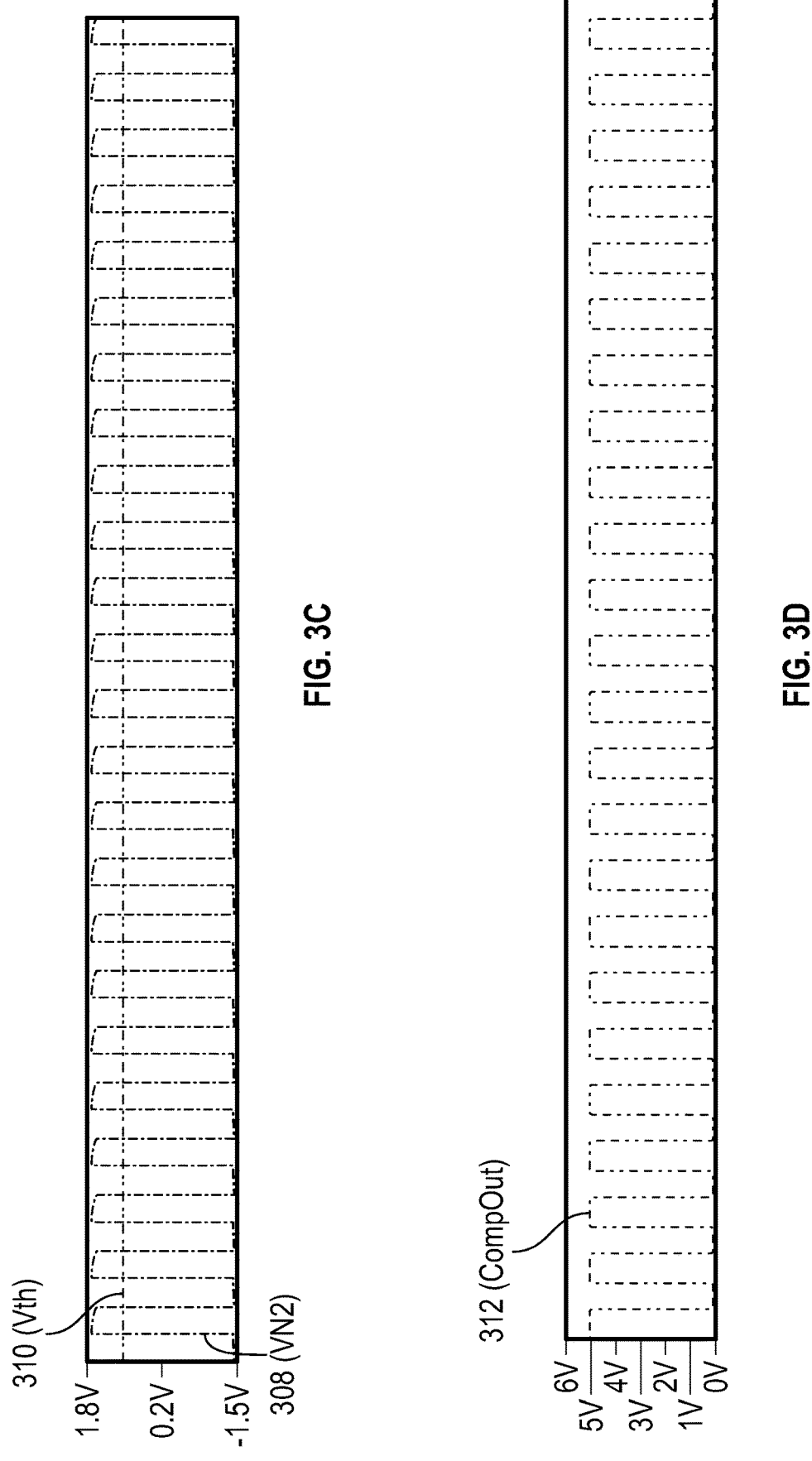

FIG. 3B gives generally shows the voltage at N1 (Vb) shown by trace 306. FIG. 3C shows the voltage at N2 (VN2) in the case where the voltage divider had been included. This reduced voltage is illustrated by trace 308. FIG. 3C also shows threshold voltage Vth shown by trace 310. As noted above, the comparator 200 will compare VN2 to the threshold. If VN2 periodically rises above Vth, the comparator 200 will produce a pulsed output at CompOut and as illustrated by trace 312. The controller 22 can then determine that the voltage being provided by the voltage source 26 of FIG. 1 is producing a sufficiently voltage.

Figures 4C, 4D:
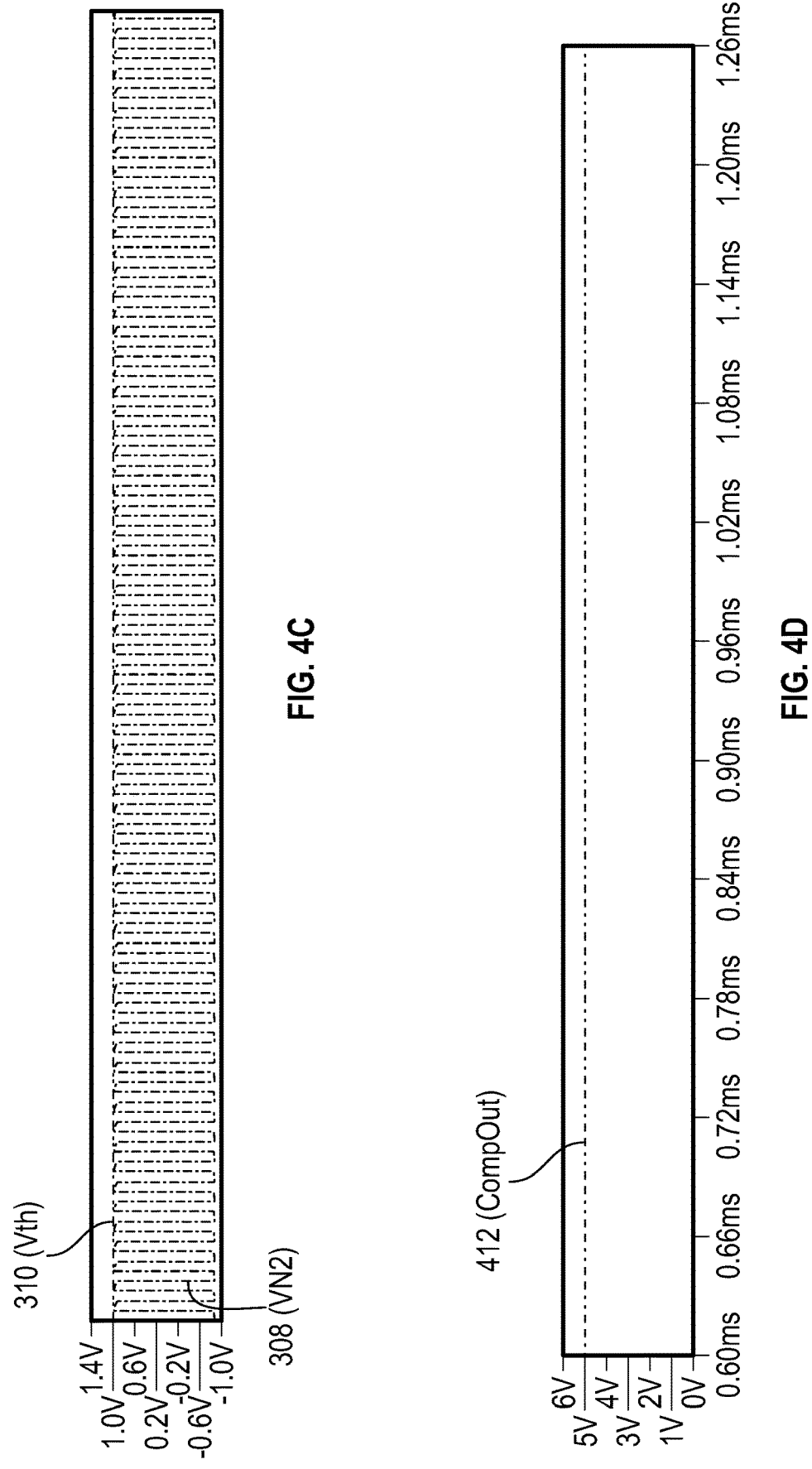

With further reference to FIGS. 4A-4D, now consider the case where the input voltage on the primary side 60 drops. In this example, instead of 27V as in FIG. 3A, assume Vin has fallen to 16V. In this case, assume that it is desired to keep Vin above 17V. This desired input value can be referred to as an input voltage threshold. This voltage drop at Vin will result in the in proportional voltage on the secondary side 62. This is illustrated in FIG. 4A with Vout falling to, for example, 9V as shown in FIG. 4A. This will result in the comparator output remaining high, with no toggling (see e.g., FIG. 4D).

FIG. 4B gives generally shows the voltage at N1 (Vb) shown by trace 306 in the reduced voltage situation. FIG. 4C shows the voltage at N2 (VN2) in the case where the voltage divider had been included. This reduced voltage is illustrated by trace 308. FIG. 4C also shows threshold voltage Vth shown by trace 310. As noted above, the comparator 200 will compare VN2 to the threshold. In this example, VN2 does not periodically rises above Vth. As such, the comparator 200 will produce constant output CompOut and as illustrated by trace 412. The controller 22 can then determine that the voltage being provided by the voltage source 26 of FIG. 1 is producing has fallen and take remedial action.

In the above example, the input voltage threshold for the input to the fly-back circuit 40 was set to 16V. That is, the comparator output (CompOut) shall toggle when the input is greater than 16V at the primary side and cease to toggle when it drops below 16V. This can be done (as opposed to in the prior art) by monitoring Vb in instead of the input voltage provided by the voltage source 26 (or any other value on the primary side 60). Stated differently, the voltage monitor 20 can be electrically coupled to but galvanically isolated from the voltage source 26. While the above examples have been given for a 15V output voltage, the voltage divider 202 could be adjusted for other expected values of Vout.

Figure 5:
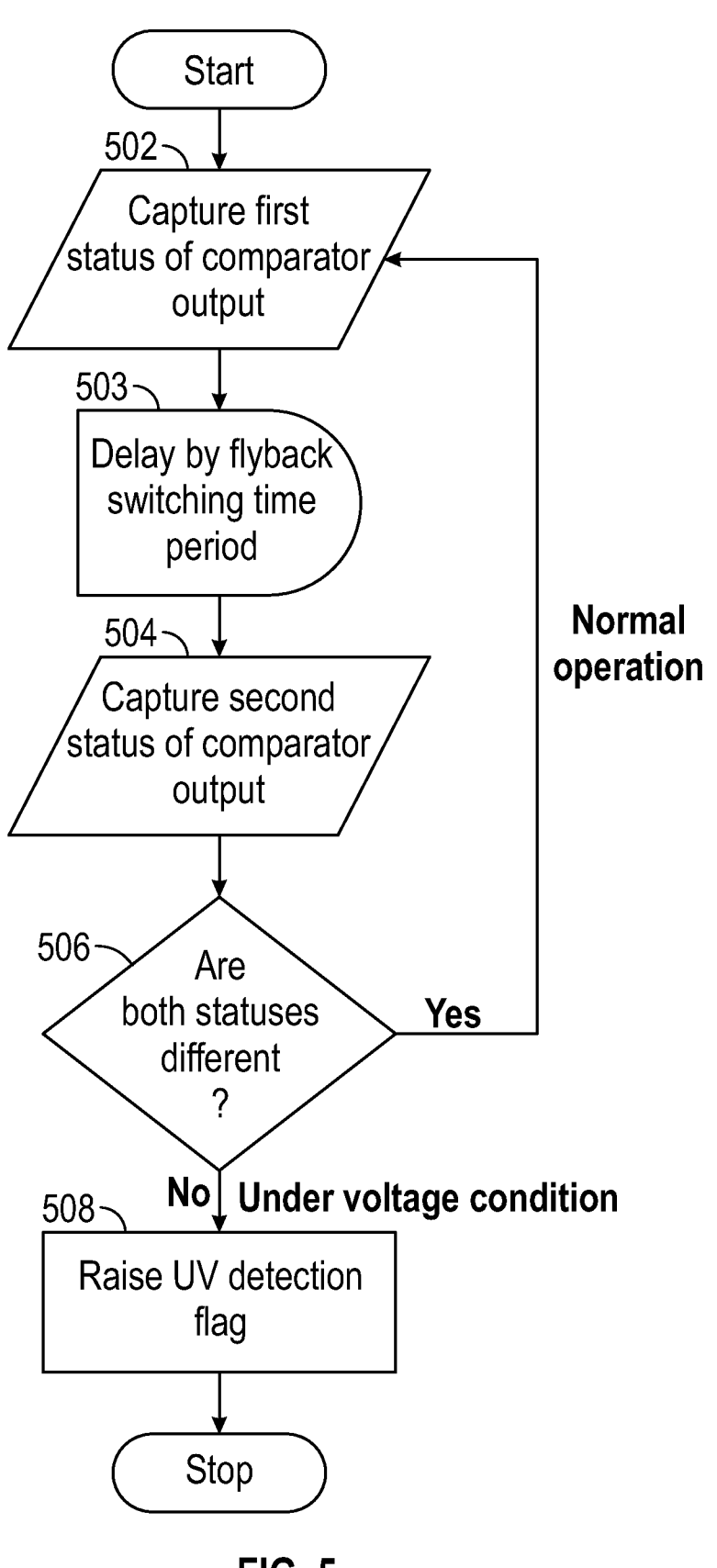
FIG. 5 shows a method of operating the fly-back converter of FIGS. 1 and 2.

FIG. 5 shows a flow chart of a method according to one embodiment. This is one method of monitoring the output (CompOut) of the comparator 200. In short, if CompOut is toggling (see FIG. 3D) it can be assumed that the voltage provided by the voltage source 26 has not fallen too low for desired operation. However, if CompOut is not toggling then the control device 22 may raise an input undervoltage flag. This flag can be utilized by, for example, a higher-level system which can command the unit to enter a fail-safe mode.

At block 502 a first sample of the output of the comparator 200 can be taken. Then, at block 504 a second sample can be taken. This sample can be taken at a time that is delayed by known delay period. That period can be, for example, the fly-back switching period as indicated by block 503. The two samples are compared at block 506. If they are the same, the controller can determine a low voltage situation has arisen and raise an alarm or other flag (block 508). If they are different (e.g., CompOut is toggling), it can be determined that the voltage source is providing the determined minimum voltage and processing can return to block 502.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof.

Therefore, it is not intended that the present disclosure be limited to the embodiment disclosed as the best mode contemplated for carrying out this present disclosure, but that the present disclosure will include all embodiments falling within the scope of the claims.

What is claimed is:

1. A fly-back circuit comprising:
   a voltage source;
   a transformer comprising a primary winding electrically coupled to the voltage source and a secondary winding electrically coupled to a load;
   a diode connected between the secondary winding and the load;
   a switch electrically coupled to the primary winding;
   a controller operable to open and close the switch to control energy transfer from the primary winding to the secondary winding; and
   wherein a voltage monitor includes a comparator that generates an output signal, the comparator having a first input connected to a node between the secondary winding and the diode and a second input connected to a monitor threshold voltage,
   and wherein the output signal being a toggling output when the voltage source is operating above an input voltage threshold and a constant output when the voltage source is operating below the input voltage threshold.

2. The fly-back circuit of claim 1, further comprising:
   a control device connected to an output of the voltage monitor that determines that the voltage based on whether the output signal is toggling or not toggling.

3. The fly-back circuit of claim 1, further comprising a voltage divider between the node and the first input.

4. The fly-back converter of claim 3, wherein the first input is an inverting input and the second input is a non-inverting input.

5. The fly-back circuit of claim 1, wherein the first input is an inverting input and the second input is a non-inverting input.

6. The fly-back converter of claim 1, wherein the controller is a pulse width modulation controller operable to output a sequence of pulses to open and close the switch based on determining that the voltage source exceeds a minimum control voltage.

7. A method comprising:

providing with a voltage source an input voltage to a primary side of a fly-back circuit that includes primary winding and a secondary winding;

controlling a switch electrically coupled to the primary winding to transition between an open state and a closed state to control energy transfer from the primary winding to the secondary winding;

monitoring voltage with a voltage monitor at a node between the secondary winding and a diode with a comparator whose first input is connected to the node and whose second input is connected to a monitor threshold voltage; and generating with the comparator an output signal with the voltage monitor that is a toggling output when the voltage source is operating above an input voltage threshold and a constant output when the voltage source is operating below the input voltage threshold.

8. The method of claim 7, further comprising:

analyzing with a control device connected to an output of the voltage monitor to determine that determines that the voltage based on whether the output signal is toggling or not toggling.

9. The method of claim 8, wherein analyzing includes:

taking first and second measurements of a signal at the output of the voltage monitor, wherein the first and second measurement are delayed in time from one another;

determining that the first and second measurements are different from one another; and returning to the step of taking.

10. The method of claim 8, wherein analyzing includes:

taking first and second measurements of a signal at the output of the voltage monitor, wherein the first and second measurement are delayed in time from one another;

determining that the first and second measurements are the same; and generating a flag indicating that the input voltage has fallen below a desired threshold.

11. The method of claim 7, wherein the first input is an inverting input and the second input is a non-inverting input.

* * * * *